(12) United States Patent
Lim

(10) Patent No.: US 6,426,307 B2
(45) Date of Patent: Jul. 30, 2002

(54) METHOD OF MANUFACTURING AN ALUMINUM OXIDE FILM IN A SEMICONDUCTOR DEVICE

(75) Inventor: Chan Lim, Kyungki-Do (KR)

(73) Assignee: Hyundai Electronics Industries Co., Kyungki-Do (KR)

( * ) Notice: Subject to any disclaimer, the term of this patent is extended or adjusted under 35 U.S.C. 154(b) by 0 days.

(21) Appl. No.: 09/882,011

(22) Filed: Jun. 15, 2001

(30) Foreign Application Priority Data

Jun. 20, 2000 (KR) .......................................... 00-33976

(51) Int. Cl.⁷ .............................................. H01L 21/31
(52) U.S. Cl. ...................... 438/778; 438/779; 438/216; 257/192
(58) Field of Search ................................ 438/778, 779, 438/216; 257/192; 118/723; 117/93, 104

(56) References Cited

U.S. PATENT DOCUMENTS

| | | | | |
|---|---|---|---|---|
| 5,923,056 A | * | 7/1999 | Lee et al. .................. | 257/192 |
| 6,124,158 A | * | 9/2000 | Dautartas et al. .......... | 438/216 |
| 6,203,613 B1 | * | 3/2001 | Gates et al. ................ | 117/104 |
| 6,270,572 B1 | * | 8/2001 | Kim et al. .................. | 117/93 |
| 6,287,965 B1 | * | 9/2001 | Kang et al. ................ | 438/648 |
| 6,305,314 B1 | * | 10/2001 | Sneh et al. ............ | 118/723 R |

* cited by examiner

Primary Examiner—John F. Niebling
(74) Attorney, Agent, or Firm—Marshall, Gerstein & Borun

(57) ABSTRACT

In a method of manufacturing an aluminum oxide film using atomic layer deposition, alcohol is delivered as an oxygen source instead of water vapor into a reactor via a different delivery line from an aluminum source. Thus, the disclosed method can prevent degradation of an aluminum oxide thin film in uniform fashion by a chemical vapor deposition method that is parasitically generated. Also, an activation gas is delivered into the reactor at about the same time an aluminum source and an alcoholic gas is delivered. Therefore, the disclosed method can prevent reduction in the deposition rate and also prohibit degradation in an electrical property by impurity.

6 Claims, 1 Drawing Sheet

METHOD OF MANUFACTURING AN ALUMINUM OXIDE FILM IN A SEMICONDUCTOR DEVICE

BACKGROUND OF THE INVENTION

1. Field of the Invention

The invention relates generally to a method of manufacturing an aluminum oxide film in a semiconductor device. More particularly, the invention relates to a method of manufacturing an aluminum oxide film in a semiconductor device wherein an aluminum oxide film is formed using an atomic layer deposition (ALD) method.

2. Description of the Background

Generally, in the manufacture process of a highly integrated memory devices, aluminum oxide, or $Al_2O_3$, has been widely used as a dielectric film of a capacitor and a $H_2$ penetrating device film.

A method of manufacturing an Aluminum oxide film using an ALD method includes alternately spraying an aluminum source and oxygen-containing raw material onto a substrate surface, while keeping the temperature of an aluminum substrate between about 200° C. and about 450° C. and utilizing a purge process between the raw materials to remove remaining source materials, thus completing deposition of a thin film. Generally, trimethyl aluminum (TMA) is used as the aluminum source, and water vapor is used as the oxygen-containing material. Since water vapor strongly adheres to surrounding materials at temperatures greater than its vaporization temperature, the path along which the water vapor travels must be purged for a long time after the water vapor is supplied to the reactor in order to remove the water vapor, and the delivery line of the water has to be heated. If the water vapor is not completely removed from the path it travels through, e.g., a delivery line, it may react with an aluminum source to form an Aluminum oxide thin film by a parasitic chemical vapor deposition (CVD) method. Therefore, ALD and CVD deposition methods are mixed, so that an irregular thin film is deposited.

In order to overcome the drawback of water vapor as the oxygen-containing raw material, various alcohols are used instead. In this case, however, as the alcohol molecules are significantly larger compared to those of the water vapor, a problem exists in that the growth rate of the thin film per unit cycle during ALD deposition is significantly lowered. Also, when TMA, as the aluminum source, and an alcohol are used, carbon is included in the Aluminum oxide thin film causing an electrical property of the thin film to be degraded.

SUMMARY OF THE INVENTION

A method of manufacturing an aluminum oxide film in a semiconductor device includes a first step of substantially simultaneously delivering an aluminum source and an activation gas into a reactor in which a wafer is mounted, via different delivery lines; a second step of removing unreacted aluminum source from the reactor; a third step of substantially simultaneously delivering a reactive alcoholic gas and an activation gas into the reactor via same delivery lines; a fourth step of removing unreacted alcohol from the reactor; and a fifth step of performing a cycle comprising repeating the first step through the fourth step at least one time.

BRIEF DESCRIPTION OF THE DRAWINGS

The aforementioned aspects and other features will be explained in the following description, wherein:

The sole FIGURE is a schematic view illustrating a deposition apparatus useful for manufacturing an aluminum oxide film in a semiconductor device.

DETAILED DESCRIPTION OF PREFERRED EMBODIMENTS

Figure 1:
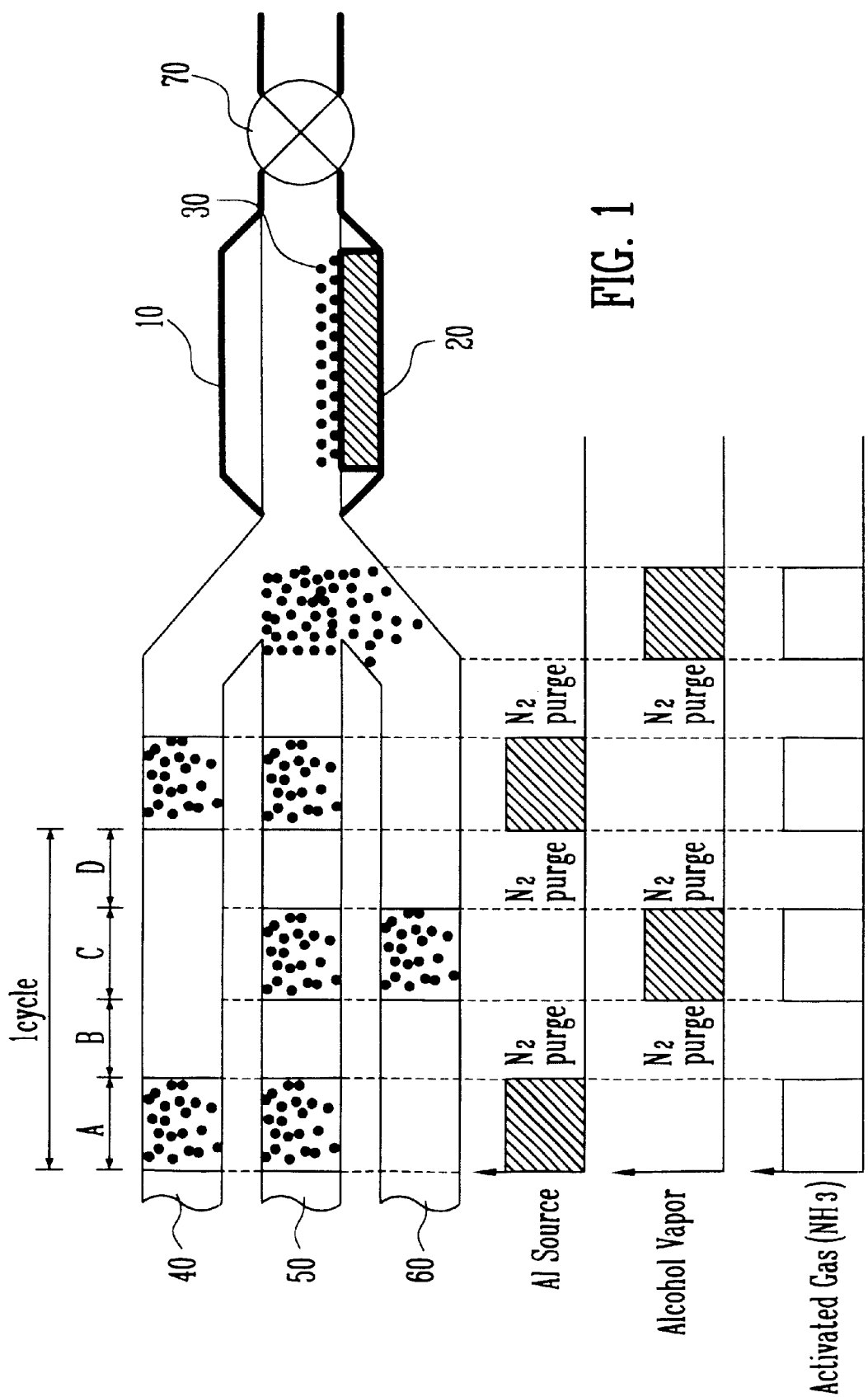

The disclosed method comprehends manufacturing an aluminum oxide film in a semiconductor device, which is uniform and has a good coverage property and less impurity, by delivering an aluminum source and an activation gas from different delivery lines simultaneously to deposit an aluminum oxide film, using alcohols instead of water vapor as an oxygen-containing raw material is described.

The disclosed method will be described in detail by way of a preferred embodiment with reference to an accompanying drawing.

Referring to the FIGURE, an apparatus for depositing aluminum oxide film by means of an ALD method includes a reactor 10 including an exhaust pump 70, a first delivery line 40 for delivering an aluminum source, a second delivery line 50 for delivering an activation gas, and a third delivery line 60 for delivering alcohol vapors. The conditions for depositing the aluminum oxide film are as follows: a wafer 20 is maintained at a temperature of about 200° C. to about 450° C. and the pressure of the reactor 10 is maintained within the range of about 50 mTorr to about 300 mTorr. The steps for forming the aluminum oxide film will be explained below.

In a step A of injecting an aluminum source, the aluminum source is injected into the reactor 10 via the first delivery line 40 for about 0.1 second to about 3 seconds, so that the aluminum source can adhere to the surface of the wafer 20. In a preferred embodiment TMA and modified TMA (MTMA) are selected as aluminum sources. At this time, an activation gas is delivered into the reactor at the rate of about 20 sccm (standard cubic centimeter per second) to about 1000 sccm at about the same time the aluminum source is injected. In a preferred embodiment ammonia ($NH_3$) gas is selected as the activation gas. If the activation gas is delivered via the first delivery line 40 through which the aluminum source is delivered, this results in parasitically generated particles within the delivery line 40. Therefore, the activation gas is preferably delivered via a different second delivery line 50. The aluminum source may include TMA or MTMA. Since MTMA exists in a solid state at room temperature and exists in a liquid state at temperatures greater than 30° C. and converts to vapor state in the temperature range of between about 50° C. and about 100° C. , use of MTMA as the aluminum source requires that the temperature of the source material container must be within the range between about 50° C. and about 100° C. and the temperature of the source delivery line must be within the range of between about 70° C. and about 180° C.

In a first purge step B, either a nitrogen ($N_2$) gas is injected for about 0.1 second to about 3 seconds or a vacuum purge is implemented to purge unreacted aluminum source into the exhaust pump 70 without adhering to the wafer 20. The reason that the unreacted aluminum source is purged is to prevent formation of particles due to reaction with gas injected in a subsequent process.

In a step C, alcohol in a vapor state, as an oxygen reactive gas, is injected into the reactor 10 via a third delivery line 60 for about 0.1 second to about 3 seconds so the alcohol adheres to the surface of the wafer 20. In a preferred embodiment, the alcohol is selected from the group consisting of methanol ($CH_3OH$), ethanol ($C_2H_5OH$), and isopropanol ($CH_3CH(OH)CH_3$). Also, ammonia gas, as the activation gas, is delivered via the third delivery line 60 at a rate of about 20 sccm to about 1000 sccm at about the same time the alcohol is delivered.

In a second purging step D, nitrogen ($N_2$) gas is injected for about 0.1 second to about 3 seconds or a vacuum purge is implemented to purge unreacted alcohol into the exhaust pump 70 without adhering to the wafer 20.

The four steps A, B, C, and D constitute one cycle for depositing an aluminum oxide film 30. Therefore, in order to deposit an oxide film having a desired thickness, the cycle is repeatedly performed.

In the above steps, if the alcohol vapor is delivered without ammonia gas as the activation gas, relatively fewer molecules are available to react with the methyl groups of TMA because the alcohol molecule is comparatively larger than $H_2O$. As a result, the coverage of the aluminum oxide film per cycle is reduced. In contrast, ammonia gas can be delivered with the alcohol. This results in the reaction between the alcohol and a hydrogen group of the ammonia gas so that a corresponding alkane is released such as methane ($CH_4$), ethane ($C_2H_6$), and propane ($C_3H_8$). The hydroxide group of the alcohol can be reacted with a methyl group of the TMA, thus forming a terminal OH group on the surface. Thus, as the alcohol and the ammonia gas are delivered simultaneously, a dissolution reaction of the alcohol takes place instead of leaving a large molecule on the surface of the wafer. The dissolution reaction can prevent the phenomenon in which the thickness of the aluminum oxide film per cycle is reduced as the case when using $H_2O$. Also, this process can reduce the concentration of impurities such as carbon and hydrogen within the aluminum oxide film.

The aluminum oxide film formed by the above steps may be used as $H_2$ barrier film after a gate dielectric, a BST capacitor, a Y1 capacitor, a PZT capacitor, a $Ru/Ta_2O_5/Ru$ capacitor and a $TiN/Ta_2O_5/Ru$ capacitor are formed thereon.

As mentioned above, the invention has an outstanding effect of reducing impurities within a thin film to improve degradation of an electrical property by forming an aluminum oxide film by means of an atomic layer deposition method using an activation gas.

The invention has been described with reference to a particular embodiment in connection with a particular application. Those having ordinary skill in the art and access to the teachings of the invention may recognize additional modifications and applications within the scope thereof.

It is therefore intended by the appended claims to cover any and all such applications, modifications, and embodiments within the scope of the invention.

What is claimed is:

1. A method of manufacturing an aluminum oxide film in a semiconductor device, comprising the sequential steps of:
   (a) simultaneously delivering an aluminum source and an activation gas into a reactor in which a wafer is mounted, via different delivery lines;
   (b) removing unreacted aluminum source from the reactor;
   (c) substantially simultaneously delivering a reactive alcohol gas and an activation gas into the reactor, via a same delivery line;
   (d) removing unreacted alcohol gas from the reactor; and
   (e) repeating steps (a) through (d) at least once.

2. The method according to claim 1, wherein the pressure of the reactor is within the range of about 50 mTorr to about 300 mTorr and the temperature of the wafer is within the range of about 200° C. to about 450° C.

3. The method according to claim 1, wherein the aluminum source is delivered into the reactor within about 0.1 second to about 3 seconds using either trimethyl aluminum (TMA) or modified trimethyl aluminum (MTMA).

4. The method according to claim 1, wherein the aluminum source comprises MTMA, the temperature of an aluminum source container is in the range of about 50° C. to about 100° C., and the temperature of an aluminum delivery line is in the range between about 70° C. and about 180° C.

5. The method of claim 1, wherein the activation gas includes ammonia gas and is delivered into the reactor for about 0.1 second to about 3 seconds at a flow rate of about 20 sccm to about 1000 sccm.

6. The method of claim 1, wherein the alcohol is selected from the group consisting of methanol ($CH_3OH$), ethanol ($C_2H_5OH$), and isopropanol ($CH_3CH(OH)CH_3$) and is delivered into the reactor for about 0.1 second to about 3 seconds.

* * * * *